United States Patent

Osano et al.

[11] Patent Number: 5,429,731
[45] Date of Patent: Jul. 4, 1995

[54] METHOD FOR FORMING A SOFT MAGNETIC NITRIDE LAYER ON A MAGNETIC HEAD

[75] Inventors: Koichi Osano, Sakai; Hiroshi Sakakima, Tsuzuki; Keita Ihara; Mitsuo Satomi, both of Katano; Kumio Nago, Ikoma; Youichi Ohnishi, Higashiosaka; Kunio Tanaka, Toyonaka; Hitoshi Yamanishi, Higashiosaka, all of Japan

[73] Assignee: Matsushita Electric Industrial Co., Ltd., Osaka, Japan

[21] Appl. No.: 86,364

[22] Filed: Jul. 6, 1993

Related U.S. Application Data

[63] Continuation of Ser. No. 766,794, Sep. 27, 1991, abandoned.

[30] Foreign Application Priority Data

Sep. 28, 1990 [JP]  Japan .................................. 2-260896

[51] Int. Cl.[6] ............................................. C23C 14/34
[52] U.S. Cl. .............................. 204/192.2; 204/192.15; 204/192.23
[58] Field of Search ............ 204/192.15, 192.2, 192.23

[56] References Cited

U.S. PATENT DOCUMENTS

| | | | |
|---|---|---|---|
| 4,231,816 | 11/1980 | Cuomo et al. | 204/192.2 X |
| 4,640,755 | 2/1987 | Sato | 204/192.2 |
| 4,663,193 | 5/1987 | Endo et al. | 204/192.2 X |
| 4,816,127 | 3/1989 | Eltoukhy | 204/192.2 X |
| 4,865,709 | 9/1989 | Nakagawa et al. | 204/192.2 X |
| 4,904,543 | 2/1990 | Sakakima et al. | 204/192.2 X |
| 5,004,652 | 4/1991 | Lal et al. | 204/192.2 X |

FOREIGN PATENT DOCUMENTS 64-15366  1/1989  Japan .

*Primary Examiner*—Nam Nguyen
*Attorney, Agent, or Firm*—Wenderoth, Lind & Ponack

[57] ABSTRACT

The present invention relates to a method for forming a layer of isotropic soft magnetic nitride alloy even by means of mass-production apparatus wherein a target size is large in comparison to a distance between a substrate and a target, by using a bias sputtering method wherein a negative bias voltage is continuously applied to a substrate and sputtering is carried out in Ar atmosphere mixed with nitrogen gas or periodically mixed with nitrogen gas. Furthermore, the present invention may include a heat treatment of the soft magnetic nitride alloy layer deposited on the substrate in a temperature of more than 300°°C. to less than 800° C. to improve a soft magnetic characteristic.

5 Claims, 2 Drawing Sheets ly applied to a substrate and sputtering is carried out in Ar atmosphere mixed with nitrogen gas. Further, according to the present inven-
METHOD FOR FORMING A SOFT MAGNETIC NITRIDE LAYER ON A MAGNETIC HEAD This application is a continuation of now abandoned application, Ser. No. 07/766,794, filed on Sep. 27, 1991 abandoned.

BACKGROUND OF THE INVENTION

The present invention relates to a method for forming a layer of soft magnetic alloy suitable to magnetic heads used for VTR and the like.

Hitherto, there has been known a method for forming a layer of soft magnetic nitride alloy by means of a reactive sputtering in Ar atmosphere containing nitrogen gas and a method for forming a layer of soft magnetic super structure nitride alloy comprising a nitride layer and a non-nitride layer by means of a reactive sputtering in Ar atmosphere periodically mixed with nitrogen gas (see Japanese Patent Koukai No. 210607/1987 and No. 254708/1988). There has been also known a method for forming a nitride alloy having a soft magnetic superstructure by means of applying a bias voltage on a substrate in an on/off manner with object of obtaining good and effective productivity of their layers (see Japanese Patent Koukai No. 15366/1989).

In these methods, however, there is relatively no problem where small a sputter target is used and the target is positioned opposite to a substrate, but there remains problems in that where a larger target is used in comparison to a distance between a substrate and a target, many oblique incident components of vapor deposited elements cause to magnetic anisotropy on the deposited layer, which does not become an isotropic soft magnetic one and does not show an isotropic high permeability.

SUMMARY OF THE INVENTION

The object of the present invention is to provide a method for forming a layer of isotropic soft magnetic nitride alloy even by means of mass-production apparatus wherein a target size is large in comparison to a distance between a substrate and a target.

For accomplishing the above object, according to the present invention, there is provided a method characterized in that a target to be used comprises an alloy having composition ratio represented by the formula Ma'Tb'Xc' wherein a', b' and c' is defined below and a layer of soft magnetic nitride alloy having composition ratio represented by the formula TaMbXcNd is formed by means of bias sputtering method wherein a negative bias voltage is continuously applied to a substrate and sputtering is carried out in Ar atmosphere mixed with nitrogen gas. Further, according to the present invention, there is provided an another method characterized in that Ar and $N_2$ are periodically mixed together and reacted with depositing elements to give on a substrate a superstructure layer of soft magnetic nitride which is laminated with nitride layers and non-nitride layers alternatively. Furthermore, the present invention may include a heat treatment of the soft magnetic nitride alloy layer deposited on the substrate in a temperature of more than 300° C. to less than 800° C. to improve a soft magnetic characteristic.

In the above formula, T is at least one metal selected from the group consisting of Fe, Co and Ni. M is at least one metal selected from the group consisting of Nb, Zr, Ti, Ta, Hf, Cr, Mo, W and Mn. X is at least one half metal or semiconductor element selected from the group consisting of B, C, Si, Ge and Al. N is nitrogen. Each of a', b', c', a, b, c and d indicates atomic percentage and their relation is as follows.

$70 \leq a' \leq 99$ $0 \leq b' \leq 20$ $0 \leq c' \leq 20$ $1 \leq b' + c'$ $65 \leq a \leq 98$ $0 \leq b \leq 20$ $0 \leq c \leq 20$ $1 \leq d \leq 20$ $1 \leq b \leq c$ $a + b + c + d = 100$ With the above described procedure according to the present invention, there is obtained an alloy layer showing a small magnetic anisotropy and an isotropic soft magnetic characteristic which is suitable to a magnetic head used for VTR and the like, even in a case that a larger sized target in comparison to a distance between a target and a substrate, cause to produce many oblique incident components of deposited elements.

DESCRIPTION OF THE PRESENT INVENTION

Figure 1:
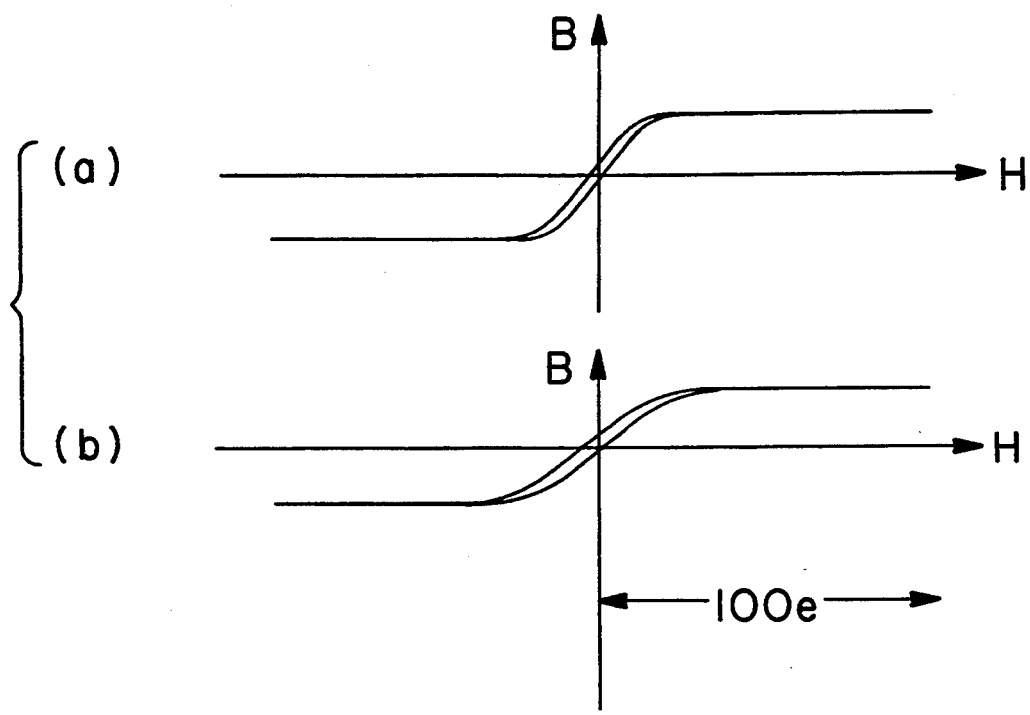
FIGS. 1(a), 2(a) and 3(a) show B–H loop characteristic on easy magnetization axis of soft magnetic nitride alloy layer according to the present invention.
FIGS. 1(b), 2(b) 3(b) show B–H loop characteristic on hard magnetization axis of soft magnetic nitride alloy layer according to the present invention.

Hereinafter, there is a description of the preferred embodiments according to the present invention.

In a layer of soft magnetic nitride alloy represented by the formula TaMbXcNd (hereinafter referred to as "alloy layer"), the following condition (1) is needed to provide a soft magnetic characteristic with the alloy layer:

$$a \leq 98, 1 \leq b+c, 1 \leq d \quad (1)$$

The following condition (2) is needed to provide a high saturation magnetization with the alloy layer:

$$65 \leq a, b \leq 20, c \leq 20 \quad (2)$$

The following condition (3) is needed to avoid the alloy layer from being stripped from a substrate by suppressing an internal stress of the alloy layer:

$$d \leq 20 \quad (3)$$

Further, the following condition (4) is needed to provide a thermally stable magnetic characteristic with the alloy layer:

$$1 \leq d \quad (4)$$

From the above all conditions, the alloy layer according to the present invention needs the following all conditions; $65 \leq a \leq 98$, $0 \leq b \leq 20$, $0 \leq c \leq 20$, $1 \leq d \leq 20$, $1 \leq b+c$, $a+b+c+d=100$.

Further, if the alloy layer is a superstructure wherein nitrogen element and so on are modulated toward a layer thickness or layer formation direction at least when the alloy layer is formed, it shows a good soft magnetic characteristic. In order to obtain the soft magnetic characteristic more than that of a nitride alloy single layer, it is desirable to use a modulated wave of less than 1000 Å.

Usually, a resultant alloy layer is hard to show a soft magnetic characteristic just after it is formed. In this case, it is usually possible to improve the soft magnetic characteristic by means for heat treatment in a magnetic field or non-magnetic field at a temperature from 300° C. to 800° C.

Hereinafter, the function and effect of the present invention are explained according to the following embodiments.

EXAMPLE 1

By using a sputtering apparatus provided with a target of Co—Nb—Zr alloy having a size of 5×15 inches and a target distance of 65 mm, a reactive sputtering is carried out in an atmosphere of Ar periodically mixed with $N_2$ to form on a water-cooled ceramic substrate an alloy layer of superstructure having an average layer composition of $Co_{78}Nb_8Zr_4N_{10}$ which comprises a non-nitride layer and a nitride layer each having a layer thickness of 250 Å and represented by the formula Co—Nb—Zr/Co—Nb—Zr—N. During layer formation time, a charge power of 2 kw, a sputtering gas pressure of $1\times10^{-2}$Torr are used and a partial pressure of nitrogen on mixing is 10%.

Figure 2:
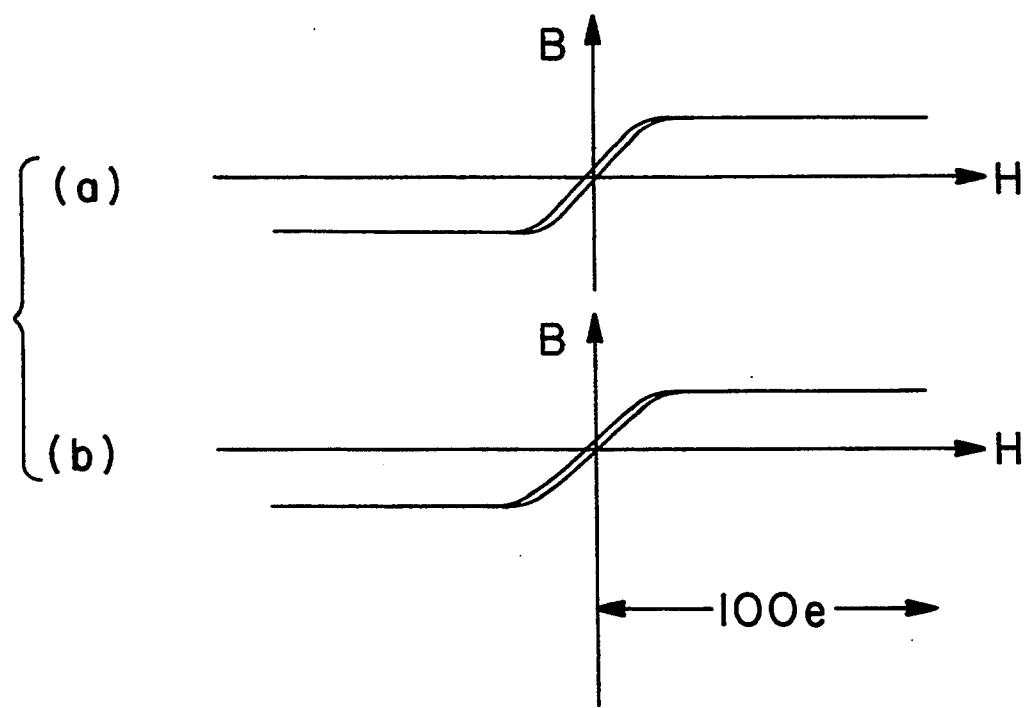
Figure 3:
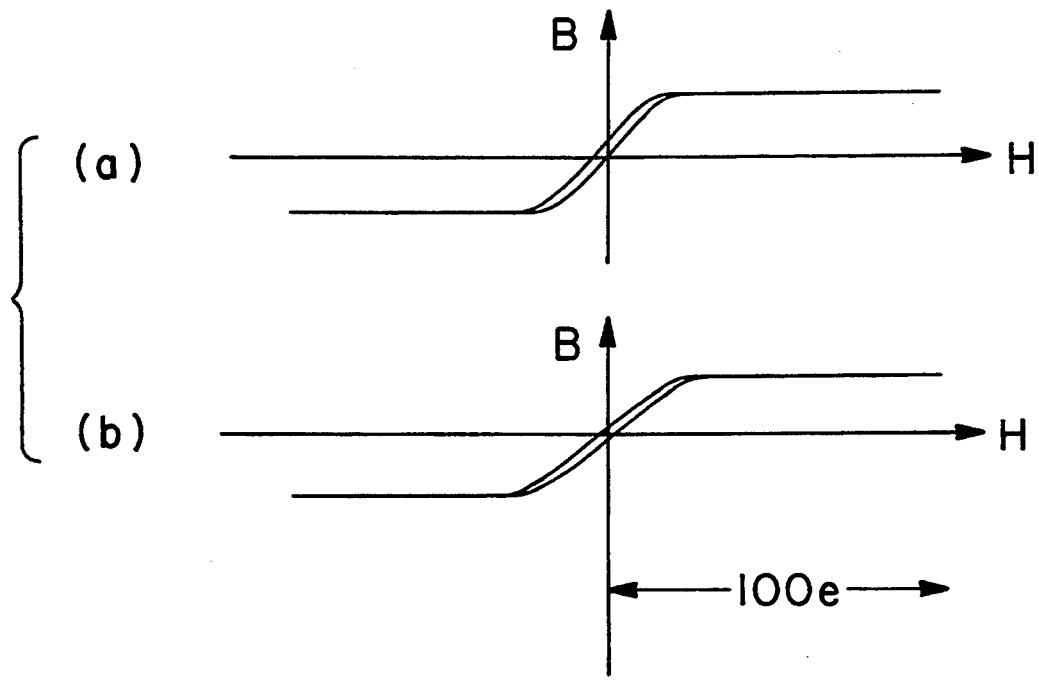
Figure 4:
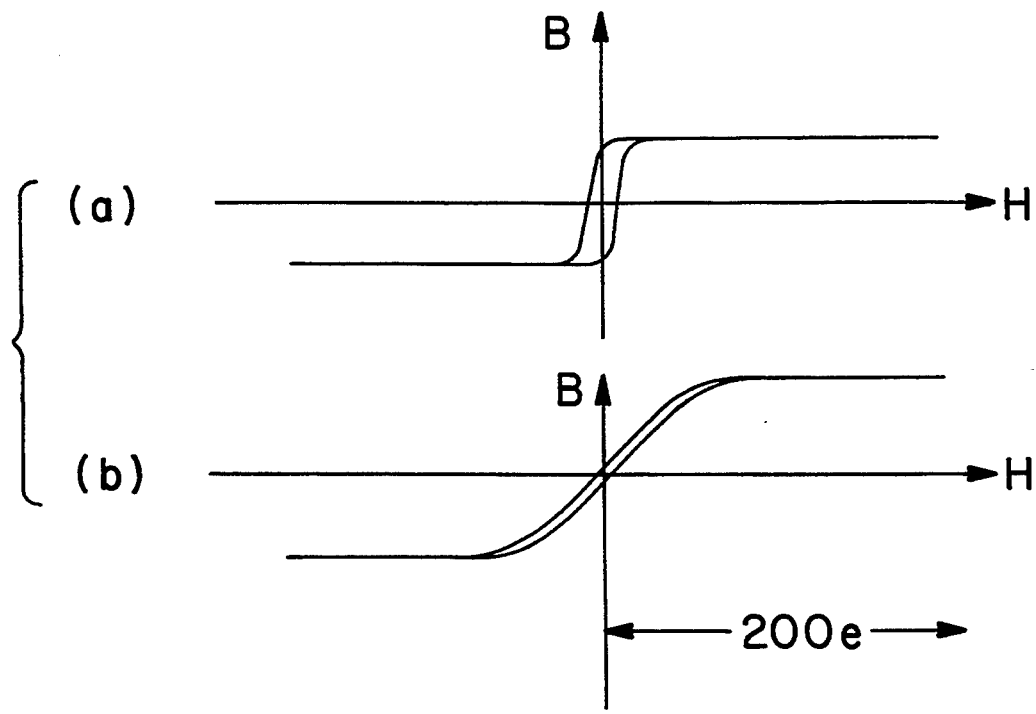
FIG. 4(a) shows B–H loop characteristic on easy magnetization axis of soft magnetic nitride alloy layer according to a conventional method.
FIG. 4(b) shows B–H loop characteristic on hard magnetization axis of soft magnetic nitride alloy layer according to a conventional method.

Further, similar sputtering tests for making the alloy layer are carried out by applying a negative bias voltage on a substrate. In the tests, a variety of bias powers, 150 W, 250 W and 350 W are used. Resultant alloy layers are subjected to a heat treatment in a rotating magnetic field at a temperature of 500° C. and then to a measurement of B-H loop at 60 Hz by means of B-H loop AC tracer. The results are shown in FIG. 1(a) wherein 150 W, axis direction of easy magnetization, in FIG. 1(b) wherein 150 W, hard axis direction, and in FIG. 2(a) wherein 250 W, axis direction of easy magnetization, in FIG. 2(b) wherein 250 W, hard axis direction, and further in FIG. 3(a) wherein 350 W, axis direction of easy magnetization, in FIG. 3(b) wherein 350 W, hard axis direction. On the contrary, FIG. 4(a) wherein 0 W, axis direction of easy magnetization and FIG. 4(b) wherein 0 W, hard axis direction are characteristic figures obtained by a conventional method. The permeability of easy and hard axis directions determined by the above B-H loop are measured by means of a vector impedance meter. The result is shown in the following TABLE 1. Apparent from the results of FIGS. 1, 2 and 3 and the TABLE 1, it is understood that the method according to the present invention is effective to make a layer having a good isotropic soft magnetic characteristic.

TABLE 1

| Co—Nb—Zr/ | permeability μ (1 MHz) | |
| Co—Nb—Zr—N | easy axis | hard axis |
| --- | --- | --- |
| with no bias | 200 | 2200 |
| with bias (power) | | |
| 150 W | 1400 | 2400 |
| 250 W | 2400 | 2600 |
| 350 W | 1200 | 2300 |

EXAMPLE 2

By using a sputtering apparatus provided with a target of Fe-Zr alloy having a size of 5×15 inches and a target distance of 60 mm, a reactive sputtering is carried out in an atmosphere of Ar mixed with N2 to form on a water-cooled ceramic substrate an alloy layer of superstructure having an average layer composition of $Fe_{79}Zr_{11}N_{10}$. During layer formation time, a charge power of 2 kw, a sputtering gas pressure of $1\times10^{-2}$Torr are used and a partial pressure of nitrogen on mixing is 2.5%.

Further, similar sputtering tests for making the alloy layer are carried out by applying a negative bias voltage on a substrate. In the tests, a variety of bias powers, 150 W, 250 W and 350 W are used. Resultant alloy layers are subjected to a heat treatment in a rotating magnetic field at a temperature of 500° C. and then to a measurement of B-H loop at 60 Hz by means of B-H loop AC tracer. The permeability of easy and hard axis directions determined by the above B-H loop are measured by means of a vector impedance meter. The result is shown in the following TABLE 2. Apparent from the TABLE 2, it is understood that the method according to the present invention is effective to make a layer having a good isotropic soft magnetic characteristic.

TABLE 2

| | permeability μ (1 MHz) | |
| Fe—Zr—N | easy axis | hard axis |
| --- | --- | --- |
| with no bias | 400 | 4800 |
| with bias (power) | | |
| 150 W | 2400 | 4300 |
| 250 W | 3800 | 4200 |
| 350 W | 3100 | 3900 |

EXAMPLE 3

By using a sputtering apparatus provided with each target of Co—Ni—Ta—Hf, Co—Nb—Ti, Co—Mo—W—Zr, Fe—Nb—Si—B, Fe—Al—Cr—Nb, Fe—Ta—C—Ge alloys having a size of 5×15 inches and a target distance of 65 mm, reactive sputtering is carried out in an atmosphere of Ar periodically mixed with $N_2$ to form on water-cooled ceramic substrates a variety of alloy layers of superstructure. During layer formation time, a charge power of 2 kw, a sputtering gas pressure of $1\times10^{-2}$ Torr are used.

Further, similar sputtering tests are carried out by applying a negative bias voltage on each substrate and a bias power of 25 W is selected. The ratio of partial pressure of nitrogen gas to the total pressure used during the sputtering step and each layer thickness of a non-nitride layer and a nitride layer in the following target cases are shown below: In a case of Co—Ni—Ta—Hf target, 10% and 200 Å In a case of Co—Nb—Ti target, 10% and 250 Å In a case of Co—Mo—W—Zr target, 7% and 250 Å In a case of Fe—Si—B target, 10% and 100 Å In a case of Fe—Al—Cr—Nb target, 5% and 100 Å In a case of Fe—Ta—C—Ge target, 2% and 100 Å

Each average layer composition of resultant layers is respectively represented by each of the formulas $Co_{73}Ni_1Ta_{10}Hf_3N_{13}$, $Co_{70}Nb_9Ti_9N_{12}$, $Co_{72}Mo_4W_5Zr_9N_{10}$, $Fe_{75}Nb_4Si_2B_6N_{13}$, $Fe_{76}Al_1Cr_1Nb_{10}N_{12}$ and $Fe_{79}Ta_8C_9Ge_2N_2$.

Resultant alloy layers are subjected to a heat treatment in a rotating magnetic field. Treating temperature of 500° C. is applyed to a superstructure of Co—Ni—Ta—Hf/Co—Ni—Ta—Hf—N, 600° C. to that of Co—Nb—Ti/Co—Nb—Ti—N, 550° C. to that of Co—Mo—W—Zr/Co—Mo—W—Zr—N, 500° C. to that of Fe—Nb—Si—B/Fe—Nb—Si—B—N and Fe—Al—Cr—Nb/Fe—Al—Cr—Nb—N, 450° C. to that of Fe—Ta—C—Ge/Fe—Ta—C—Ge—N. After the heat treatment, each alloy layer is subjected to a measuring of B-H loop at 60 Hz by means of B-H loop AC tracer. The permeability of easy and hard axis directions determined by the above B-H loop is measured by means of a vector impedance meter. The result is shown in the following TABLE 3. Apparent from the TABLE 3, it is understood that the method according to the present invention is effective to make a layer having a good isotropic soft magnetic characteristic.

The above tests show a method for forming a nitride alloy layer having a superstructure in an Ar atmosphere periodically mixed with $N_2$. However, the same effect as the above test is obtained in a nitride alloy single layer prepared by sputtering under a flow of mixture Ar and $N_2$.

Further, while the alloy layer sometimes contains a little oxygen inevitability, the oxygen atomic content of less than 3% is permissible.

TABLE 3

|  | bias (power) | permeability easy axis | permeability hard axis |
| --- | --- | --- | --- |
| Co—Ni—Ta—Hf/ | 0 W | 500 | 2700 |
| Co—Ni—Ta—Hf—N | 250 W | 2300 | 2900 |
| Co—Nb—Ti/ | 0 W | 300 | 2400 |
| Co—Nb—Ti—N | 250 W | 1900 | 2200 |
| Co—Mo—W—Zr/ | 0 W | 600 | 2500 |
| Co—Mo—W—Zr—N | 250 W | 2400 | 2600 |
| Fe—Nb—Si—B/ | 0 W | 400 | 3400 |
| Fe—Nb—Si—B—N | 250 W | 3200 | 3700 |
| Fe—Al—Cr—Nb/ | 0 W | 400 | 2900 |
| Fe—Al—Cr—Nb—N | 250 W | 2700 | 3000 |
| Fe—Ta—C—Ge/ | 0 W | 200 | 1100 |
| Fe—Ta—C—Ge—N | 250 W | 1200 | 1300 |

What is claimed:

1. A method for forming an isotropic soft magnetic nitride alloy layer on a substrate by means of sputtering wherein a target to be used comprises an alloy having composition ratio represented by the formula Ma'Tb'Xc' and the sputtering step is carried out in an atmosphere of Ar mixed with nitrogen gas and under a negative bias voltage continuously applied throughout said method to the substrate to form a single layer of soft magnetic nitride alloy having a composition ratio represented by the formula TaMbXcNd, wherein T is at least one metal selected from the group consisting of Fe, Co and Ni; M is at least one metal selected from the group consisting of Nb, Zr, Ti, Ta, Hf, Cr, Mo, W and Mn; X is at least one semimetal or semiconductor element selected from the group consisting of B, C, Si, Ge and Al; N is nitrogen; a', b', c', a, b, c and d indicate atomic percentage and their relation is as follows:

$70 \leq a' \leq 99$ $0 \leq b' \leq 20$ $0 \leq c' \leq 20$ $1 \leq b' + c'$ $65 \leq a \leq 98$ $0 \leq b \leq 20$ $0 \leq c \leq 20$ $1 \leq d \leq 20$ $1 \leq b + c$ $a + b + c + d = 100.$ 2. A method for forming an isotropic soft magnetic nitride alloy layer on a substrate by means of sputtering wherein a target to be used comprises an alloy having composition ratio represented by the formula Ma'Tb'Xc' and the sputtering step is carried out in an atmosphere of Ar periodically mixed with nitrogen gas to be reacted with an element or elements to be deposited and under a negative bias voltage continuously applied throughout said method to the substrate to form a laminated layer of soft magnetic nitride alloy comprising nitride layer or layers and non-nitride layer or layers and having an average composition ratio represented by the formula TaMbXcNd, wherein T is at least one metal selected from the group consisting of Fe, Co and Ni; M is at least one metal selected from the group consisting of Nb, Zr, Ti, Ta, Hf, Cr, Mo, W and Mn; X is at least one semimetal or semiconductor selected from the group consisting of B, C, Si, Ge and Al; N is nitrogen; a', b', c', a, b, c and d indicate atomic percentage and their relation is as follows:

$70 \leq a' \leq 99$ $0 \leq b' \leq 20$ $0 \leq c' \leq 20$ $1 \leq b' + c'$ $65 \leq a \leq 98$ $0 \leq b \leq 20$ $0 \leq c \leq 20$ $1 \leq d \leq 20$ $1 \leq b + c$ $a + b + c + d = 100.$ 3. The method for forming a soft magnetic nitride alloy layer on a substrate by means of sputtering according to claims 1 or 2, there is further including a heat treatment step of the soft magnetic nitride alloy layer deposited on the substrate in a temperature of more than 300° C. to less than 800° C. to improve a soft magnetic characteristic.

4. The method of claim 1 wherein the target is larger than the distance between the substrate and the target.

5. The method according to claim 2 wherein the target is larger than the distance between the substrate and the target.

* * * * *